United States Patent
Stermer, Jr. et al.

(10) Patent No.: US 8,962,389 B2
(45) Date of Patent: Feb. 24, 2015

(54) MICROELECTRONIC PACKAGES INCLUDING PATTERNED DIE ATTACH MATERIAL AND METHODS FOR THE FABRICATION THEREOF

(71) Applicants: William C. Stermer, Jr., Chandler, AZ (US); Philip H. Bowles, Fountain Hills, AZ (US); Alan J. Magnus, Gilbert, AZ (US)

(72) Inventors: William C. Stermer, Jr., Chandler, AZ (US); Philip H. Bowles, Fountain Hills, AZ (US); Alan J. Magnus, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 16 days.

(21) Appl. No.: 13/906,161

(22) Filed: May 30, 2013

(65) Prior Publication Data

US 2014/0353772 A1 Dec. 4, 2014

(51) Int. Cl.
*H01L 21/44* (2006.01)
*B81C 1/00* (2006.01)
*B81B 3/00* (2006.01)

(52) U.S. Cl.
CPC .......... *B81C 1/00261* (2013.01); *B81B 3/0018* (2013.01); *B81C 1/00158* (2013.01)
USPC ..... 438/106; 438/118; 438/123; 257/E21.599

(58) Field of Classification Search
USPC .................. 438/106, 118, 123; 257/E21.599
See application file for complete search history.

(56) References Cited

U.S. PATENT DOCUMENTS

| | | | |
|---|---|---|---|
| 5,465,626 A | 11/1995 | Brown et al. |
| 6,476,504 B1 | 11/2002 | Chu et al. |
| 6,822,318 B2 | 11/2004 | Honer et al. |
| 7,042,103 B2 | 5/2006 | Condie et al. |
| 7,786,602 B2 | 8/2010 | Peltz et al. |
| 7,851,254 B2 | 12/2010 | Forray et al. |
| 7,858,499 B2 | 12/2010 | Plaut et al. |
| 2002/0182774 A1 | 12/2002 | Heckman |
| 2011/0018084 A1 | 1/2011 | Shim et al. |
| 2011/0227229 A1 | 9/2011 | Bauer et al. |

FOREIGN PATENT DOCUMENTS

| | | | |
|---|---|---|---|
| KR | 1020050094820 A | 9/2005 |
| WO | 2007017757 A2 | 2/2007 |

OTHER PUBLICATIONS

Clayton, J. et al., "Screen Printable Polymers for Wafer Level Packaging: A Technology Assessment," Polymer Assembly Technology, Epoxy Technology, Inc., Billerica, MA, USA.

*Primary Examiner* — Minh-Loan Tran
(74) *Attorney, Agent, or Firm* — Ingrassia Fisher & Lorenz, P.C.

(57) ABSTRACT

Embodiments of microelectronic packages and methods for fabricating microelectronic packages are provided. In one embodiment, the fabrication method includes printing a patterned die attach material onto the backside of a wafer including an array of non-singulated microelectronic die each having an interior keep-out area, such as a central keep-out area. The die attach material, such as a B-stage epoxy, is printed onto the wafer in a predetermined pattern such that the die attach material does not encroaching into the interior keep-out areas. The wafer is singulated to produce singulated microelectronic die each including a layer of die attach material. The singulated microelectronic die are then placed onto leadframes or other package substrates with the die attach material contacting the package substrates. The layer of die attach material is then fully cured to adhere an outer peripheral portion of the singulated microelectronic die to its package substrate.

18 Claims, 5 Drawing Sheets

MICROELECTRONIC PACKAGES INCLUDING PATTERNED DIE ATTACH MATERIAL AND METHODS FOR THE FABRICATION THEREOF

TECHNICAL FIELD

Embodiments of the present invention relate generally to microelectronic packaging and, more particularly, to methods for fabricating microelectronic packages wherein die attach material is printed in predetermined pattern over a wafer prior to singulation thereof, as well as to microelectronic packages produced pursuant to such fabrication methods.

BACKGROUND

Various different approaches have been developed for packaging integrated circuits, microelectromechanical systems ("MEMS") devices, optical devices, magnetic devices, passive electronic devices, and other microelectronic devices. Several of these packaging approaches involve a die attach process wherein one or more microelectronic die are bonded to leadframes. In one common leadframe-based microelectronic packaging approach, the microelectronic die are first fabricated by processing of a semiconductor wafer, which is then singulated to separate the microelectronic die into discrete units. The singulated microelectronic die are then each placed onto the die flag of a leadframe utilizing a pick and place tool. An adhesive is dispensed over the die flag prior to placement of the microelectronic die thereon such that the die is seated in or pressed into the adhesive when positioned on the leadframe. After placement of the die, the adhesive is thermally cured to bond the microelectronic die to its leadframe, and additional process steps (e.g., wire bonding and die encapsulation) are then carried-out to complete the packaging process.

BRIEF DESCRIPTION OF THE DRAWINGS

At least one example of the present invention will hereinafter be described in conjunction with the following figures, wherein like numerals denote like elements, and.

Figure 1:
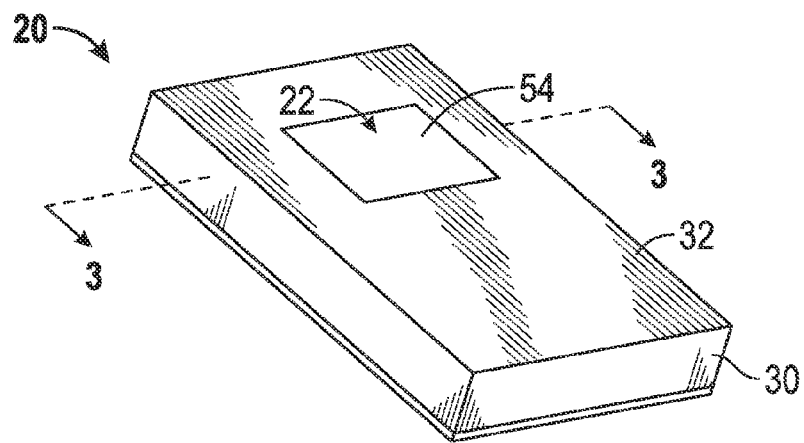
FIGS. 1 and 2 are topside and bottomside isometric views, respectively, of a microelectronic package including a layer of die attach material having a controlled central void, as illustrated in accordance with an exemplary and non-limiting embodiment of the present invention.

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a structure or layer may be described as fabricated "over" or "on" a substrate without indicating that the structure or layer necessarily contacts the substrate due to, for example, presence of one or more intervening layers.

As described in the foregoing section entitled "BACKGROUND," leadframe-based packaging approaches commonly entail the placement of singulated microelectronic die on leadframe die flags onto which an adhesive has been previously dispensed. Such die attach processes are useful in instances wherein it is desired to produce a die-to-flag bond interface across the entire underside or bottom surface of the microelectronic die. The present inventors have recognized, however, that it can be advantageous to provide a central adhesive free zone or void between the leadframe die flag and the underside of the microelectronic die in certain instances. For example, certain stress-isolated Microelectromechanical Systems ("MEMS") devices are produced to include stress relief trenches, which surround a backside cavity formed in an interior region and, preferably, a central region of the MEMS device. If the central region of the MEMS device is directly bonded to the leadframe die flag, the stress isolating capabilities of the stress relief trenches may be negatively impacted. This is particularly true for any stress relief trenches exposed through the backside of the MEMS device, which may be infiltrated with or bridged by the die attach material if contacted thereby when the die is seated on the leadframe. Thus, in such instances, it is desirable to form a central adhesive-free zone or void on the backside of the microelectronic die encompassing the region of the die containing the stress relief trenches and backside cavity. It can, however, be difficult to form such an adhesive-free zone utilizing conventional die attach techniques as such techniques are generally not amenable to patterned application of the die attach material onto the leadframe die flags. Furthermore, even if the die attach material is dispensed onto the leadframe die flags in predetermined pattern in some manner, difficulties still arise in the preservation of the adhesive-free zone due to inaccuracies inherent in the alignment between the microelectronic die and the die flags, uncontrolled flow of the die attach material when compressed between the die and die flag, and other such factors.

The following describes exemplary embodiments of a method for fabricating a plurality of microelectronic packages wherein the die attach material is printed onto microelectronic die in a predetermined pattern on a wafer level; that is, while the microelectronic die remain integrally joined in the form of a non-singulated wafer. The term "printed," as appearing herein, is defined to include any material application process enabling the application of material to a surface, such as the backside of a processed wafer, in a predefined pattern or design of the type described below. The die attach material is printed to have controlled voids corresponding to interior or interior keep-out areas provided on each die and which may encompass or contain stress relief trenches, backside cavities, or other features created on the die backside in certain embodiments. In preferred implementations of the below-described method, a partial cure of the die attach material (e.g., a B-stage cure of a B-stage epoxy) is performed prior to singulation of the wafer to harden the die attach material and thereby prevent or minimize distortion of the pattern during placement of the microelectronic die on their respective leadframes or other types of package substrates. After printing the patterned die attach material, the wafer is singulated to yield a plurality of separated die each including a bottom film or layer of die attach material having a controlled central void. The singulated die are then placed on the leadframe die flags, preferably while the die flags are heated; and the die attach material is fully cured to securely bond the die to their respective leadframes. Conventional processing steps are then performed to complete packaging of the microelectronic die. An example of a microelectronic package that may be produced pursuant to such a fabrication method will now be described in conjunction with FIGS. 1-3.

Figure 2:
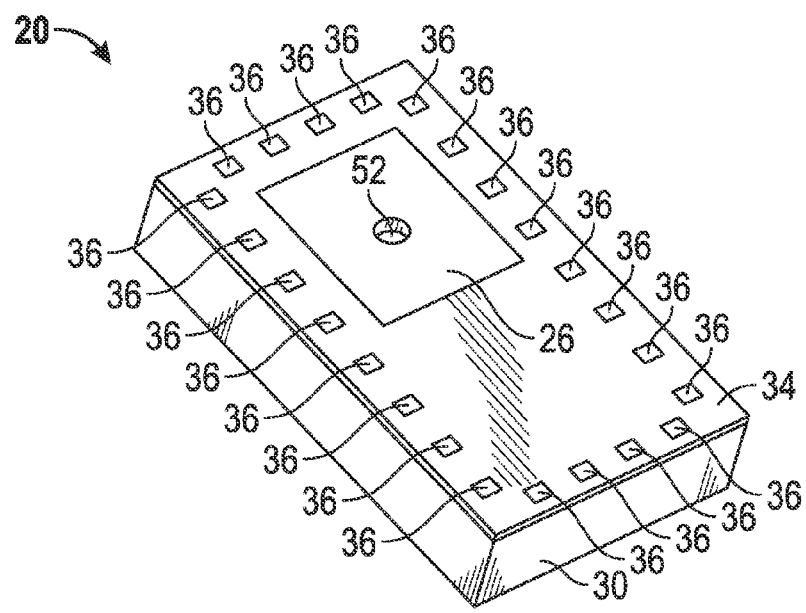
Figure 3:
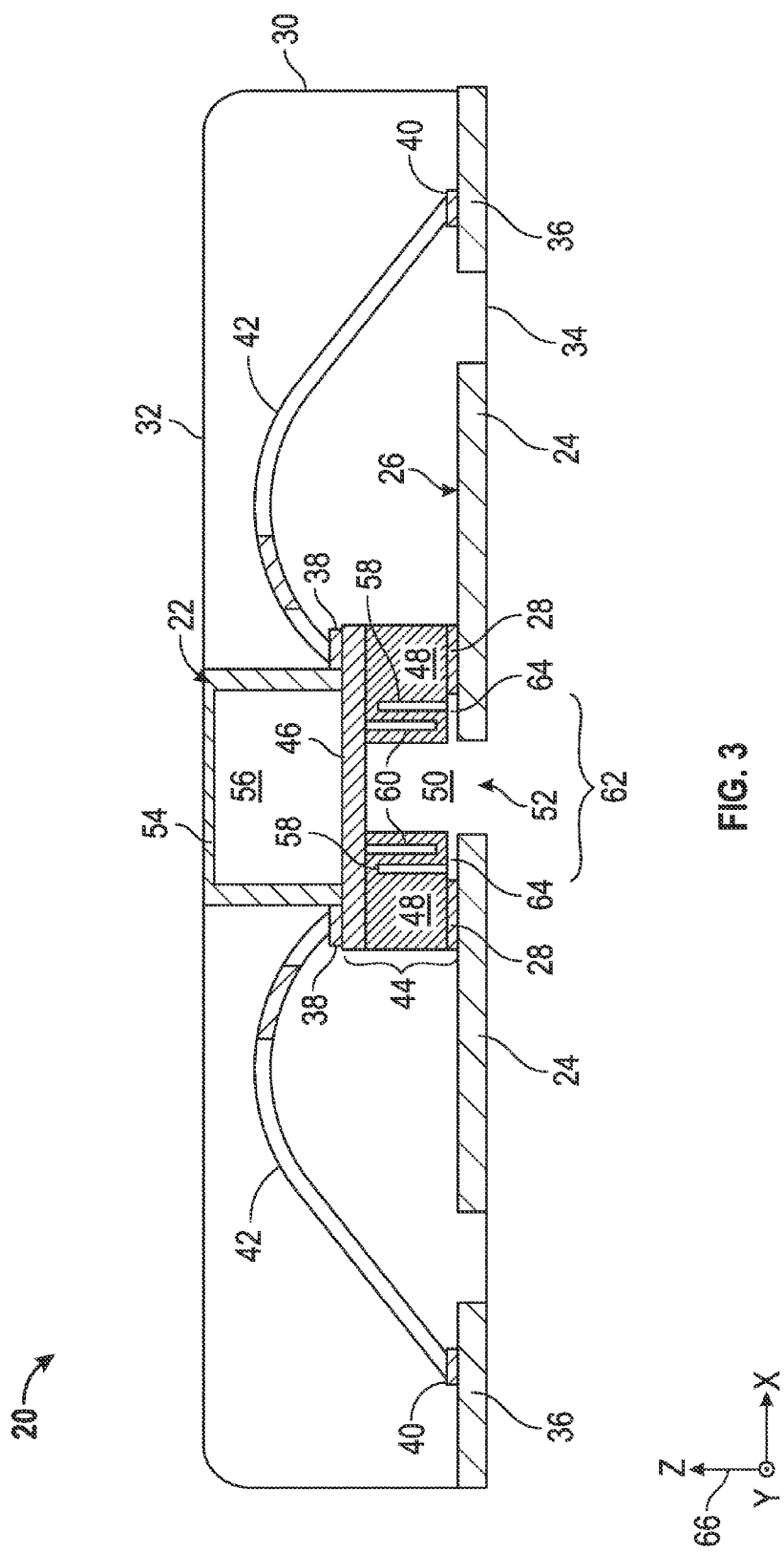
FIG. 3 is a cross-sectional view of the microelectronic package shown in FIGS. 1 and 2, as taken along line 3-3 in FIG. 1.

FIGS. 1 and 2 are isometric views of the topside and bottomside, respectively, of a microelectronic package 20, as illustrated in accordance with an exemplary and non-limiting embodiment of the present invention. Microelectronic package 20 is further illustrated in cross-section in FIG. 3, as taken along line 3-3 in FIG. 1. Microelectronic package 20 contains at least one microelectronic device 22 (FIGS. 1 and 3), which is mounted to a die flag 24 of leadframe 26 utilizing one or more layers of die attach material 28 (FIG. 3). Suitable materials for usage as die attach material 28 include certain epoxies and other liquid adhesives of the type described below in conjunction with FIG. 4. Microelectronic device 22 is encapsulated or embedded within a molded body 30 having an upper surface or topside 32 (FIGS. 1 and 3) and an opposing lower surface or bottomside 34 (FIGS. 2 and 3). A number of contacts 36 (FIGS. 2 and 3) is exposed through bottomside 34 of molded body 30 to enable interconnection of the packaged microelectronic device 22 to an electrical device (e.g., a circuit) or component (e.g., a printed circuit board) external to package 20. As shown most clearly in FIG. 3, bond pads 38 are provided on microelectronic device 22 and electrically interconnected to corresponding bond pads 40 provided on contacts 36 by wire bonds 42; however, other types of electrical interconnections can be formed between the packaged microelectronic device 22 and the externally-accessible contacts 36 of microelectronic package 20 in further embodiments.

Microelectronic package 20 may be produced utilizing a Quad Flat Pack No-Lead ("QFN") packaging approach in an embodiment. In this case, and as shown most clearly in FIG. 2, contacts 36 may be arranged in four rows, which extend around the outer periphery of bottomside 34 and which do not project outwardly therefrom. It is emphasized, however, that this is merely one example and that embodiments of microelectronic package 20 can be produced utilizing numerous different types of leadframe-based packaging approaches and non-leadframe-based packaging approaches. For example, in further embodiments, microelectronic package 20 may be produced as a no-lead package, such as a micro dual flat pack no-lead package; as a package having leads projecting outwardly from molded body 30, such as a dual or quad flat package; or as any other package wherein microelectronic device 22 is secured to a leadframe utilizing a die attach material in the manner described below.

In the exemplary embodiment illustrated in FIGS. 1-3, microelectronic device 22 assumes the form of a Microelectromechanical Systems ("MEMS") device and, specifically, a sealed Piezoresistive Transducer ("PRT") pressure sensor. It will be appreciated, however, that microelectronic device 22 need not assume the form of a MEMS device in all embodiments and may instead comprise a different type of microelectronic device, such as an integrated circuit, an optical device, a magnetic device, a passive device, or a combination of microelectronic devices packaged in a two dimensional or three dimensional package in further embodiments. Additionally, in embodiments wherein microelectronic device 22 assumes the form of a MEMS device, device 22 need not be a sealed pressure PRT pressure sensor and may instead comprise a different type of pressure sensor (e.g., a differential PRT pressure sensor or a capacitive-based pressure sensor), a MEMS sensor other than a pressure sensor (e.g., a MEMS accelerometer, gyroscope, or magnetometer), or a MEMS actuator (e.g., a MEMS oscillator). However, for reasons explained more fully below, embodiments of microelectronic device 22 are advantageously implemented as a stress-isolated MEMS pressure sensor or other stress-isolated MEMS device having one or more backside features (e.g., one or more backside cavities, stress relief trenches, or the like) that are preferably not covered by or infiltrated by the die attach material utilized to bond device 22 (and, specifically, the below-described die 44 included within device 22) to die flag 24 of leadframe 26.

Within continued reference to the exemplary embodiment shown in FIGS. 1-3, microelectronic device 22 includes a PRT die 44 containing a flexible diaphragm 46 (FIG. 3). Flexible diaphragm 46 is formed over or in an upper region of a substrate or main body 48 of PRT die 44, which may be composed of silicon or another semiconductor material in an embodiment. A backside opening or cavity 50 (also commonly referred to as a "vent hole") is formed through PRT die body 48 utilizing, for example, an etching process. Diaphragm 46 aligns with PRT backside cavity 50, as taken along an axis substantially orthogonal to the upper surface of PRT die 44 (identified as the Z-axis by coordinate legend 66 in FIG. 3). When PRT die 44 is mounted on leadframe 26, PRT backside cavity 50 aligns with an opening 52 provided through die flag 24 of leadframe 26. Thus, PRT backside cavity 50 and die flag opening 52 collectively allow fluid communication between the exposed underside of diaphragm 46 and the fluid for which pressure measurements are to be taken, such as ambient air. Opposite PRT backside cavity 50, a PRT cover or cap 54 is secured over a central portion of diaphragm 46 and encloses a hermetically-sealed cavity 56 containing a known reference pressure. The known reference pressure acts on the exposed upper face of diaphragm 46 in opposition to the monitored pressure acting on the exposed lower face of diaphragm 46. Alternatively, in embodiments wherein microelectronic device 22 is a differential pressure sensor, an opening or vent hole may be provided through PRT cap 54 (not shown in FIGS. 1-3) to allow fluid communication between the upper face of diaphragm 46 and a second pressure external to microelectronic package 20. Microelectronic device 22 is illustrated in a simplified form in FIGS. 1-3 and includes various additional features or components (e.g., a resistive-type sensor circuit, interconnect lines, voltage dividers, and the like), which are well-known within the microelectronics industry and which are not shown in FIGS. 1-3 nor described herein in the interest of concision.

PRT die 44 is advantageously fabricated to include at least one stress or strain isolation feature, which reduces the amount of mechanical stress transmitted between flexible diaphragm 46 (the transducer structure) and the neighboring components of microelectronic device 22. More specifically, PRT die 44 may be fabricated to include one or more stress relief trenches, which circumscribe or surround backside cavity 50 and the region of diaphragm 46 exposed through backside cavity 50. For example, as illustrated in FIG. 3, PRT die 44 may be fabricated to include: (i) an outer stress relief trench 58, which extends from a lower surface of PRT die body 48 toward, but not to the upper surface of body 48; and (ii) an inner stress relief trench 60, which extends from an upper surface of PRT die body 48 toward, but not to the lower surface of body 48. Stress relief trenches 58 and 60 may each have a substantially square or rectangular geometry, when viewed from a top-down or planform perspective; and may each extend around the entire periphery of PRT backside cavity 50. Outer stress relief trench 58 may circumscribe inner stress relief trench 60, which, in turn, may circumscribe PRT backside cavity 50. As shown in FIG. 3, stress relief trenches 58 and 60 may be located substantially adjacent the inner sidewalls of PRT die 44 defining PRT backside cavity 50 and may collectively form a stress relief feature, which imparts the inner region of body 48 of PRT die 44 with an increased flexibility to reduce the transmission of stress between the central portion of diaphragm 46 and other regions of PRT die 44. The instant example notwithstanding, further embodiments of PRT die 44 may employ other types of stress or strain isolation features.

Die attach material 28 bonds microelectronic device 22 (specifically, the underside of PRT die 44) to die flag 24 of leadframe 26. However, die attach material 28 only contacts an outer peripheral portion of PRT die 44 surrounding to die flag 24. Conversely, die attach material 28 does not underlie or contact a central portion 62 of the underside of PRT die 44. This portion of PRT die 44, which is referred to herein as "an interior keep-out area 62," encompasses outer stress relief trench 58, inner stress relief trench 60, and PRT backside cavity 50. As appearing herein, the term "interior keep-out area 62" refers to an area of a die surface (specifically, a die surface that is to be bonded to a leadframe or other package substrate) that is located inwardly of the outer peripheral portion of the die and that is purposefully not covered or contacted by die attach material printed onto at least an outer peripheral portion of the die surface to allow subsequent attachment of the die to the package substrate. In embodiments wherein the interior keep-out area is generally centrally located with respect to the die, such as in the exemplary embodiment shown in FIG. 3, the interior keep-out area may also be referred to as a "central keep-out area."

To form interior keep-out area 62, die attach material 28 is printed onto to PRT die 44 and a number of other integrally-formed die on a wafer level as a patterned layer or film having a number of controlled voids formed at predetermined locations corresponding to the interior or central keep-out areas of the die. The manner in which die attach material 28 is printed as a patterned layer having such controlled voids is described in detail below in conjunction with FIG. 4. When viewed from the bottomside of PRT die prior to attachment to leadframe 26, die attach material 28 may have an annular or ring-shaped geometry (e.g., that of a rectangular- or square-shaped ring), which is generally conformal with the outer peripheral portion of the underside of PRT die 44. In embodiments wherein die flag 24 of leadframe 26 overlap with stress relief trenches 58 and 60, as taken along the Z-axis (again, identified in FIG. 3 by coordinate legend 66), an axial clearance or air gap 64 may also be provided between die flag 24 and the central region of PRT die body 48 in which trenches 58 and 60 are formed. As a result of this structural configuration, die attach material 28 may be recessed from the inner circumferential edge of die flag 24 defining die flag opening 52, as generally shown in FIG. 3.

By confining die attach material 28 to an outer peripheral portion of microelectronic device 22 and preventing encroachment of die attach material into central or interior keep-out area 62, undesired inflow of the die attach material into stress relief trench 58 and backside cavity 50 is avoided and proper functioning of stress relief trenches 58 and 60 and, more generally, microelectronic device 22 is better ensured. Also, by avoiding direct adhesive attachment of the central portion of PRT die 44 to die flag 24, the flexibility of the central region of PRT die body 48 containing stress relief trenches 58 and 60 is preserved for provide optimal stress isolation. In further embodiments, confining die attach material 28 to peripheral region of die 44 surrounding keep-out area 62 may be advantageous for other reasons, as well. For example, in certain implementations, it may be desirable to prevent the die attach material from flowing over and thereby covering the central region of a microelectronic die (e.g., PRT die 44 shown in FIGS. 1 and 3) to allow subsequent access to one or more features or structures provided thereon or therein, such as one or more electrically-conductive contacts later interconnected to another device or electrically-conductive element at a subsequent stage of manufacture. Furthermore, it may be desirable to prevent a central region of a microelectronic die (e.g., PRT die 44 shown in FIGS. 1 and 3) from being directly adhered to the underlying die flag to maintain a mechanical decoupling in this region, which may reduce transmission of mechanical stress applied to the die flag (e.g., due to differences in coefficients of thermal expansion) to a central portion of the microelectronic die and, when the microelectronic die is a MEMS device, to any transducer structure that may be contained therein.

Figure 4:
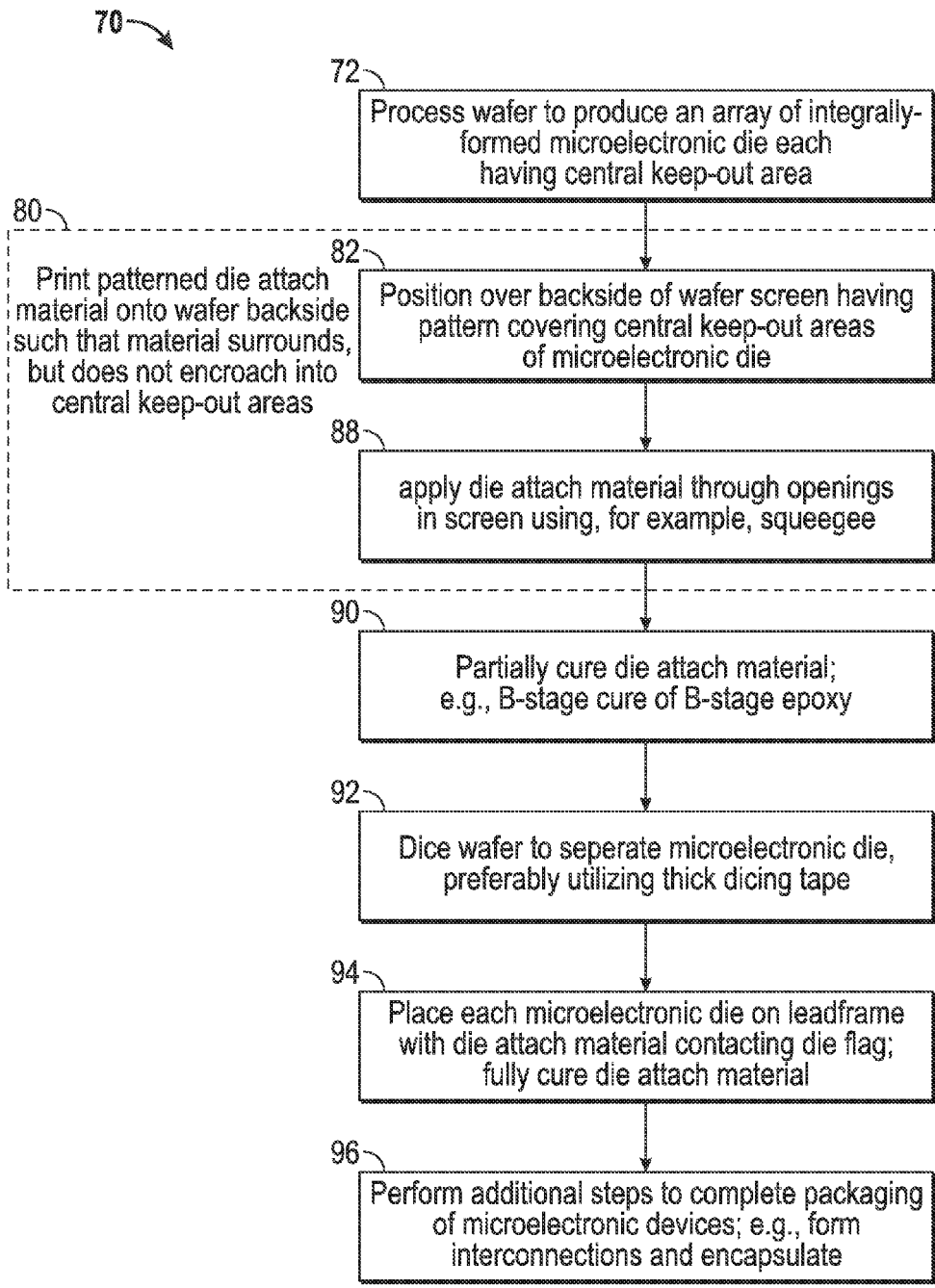
FIG. 4 is a flowchart illustrating a method for fabricating a plurality of microelectronic packages, such as the exemplary microelectronic package shown in FIGS. 1-3, wherein a die attach material is printed in a predetermined pattern over a non-singulated wafer after formation of an array of microelectronic devices thereon, as illustrated in accordance with an exemplary and non-limiting embodiment of the present invention.

FIG. 4 is a flowchart setting-forth a method 70 for fabricating a number of microelectronic packages. As shown in FIG. 4 and described below, fabrication method 70 is offered by way of non-limiting example only. It is emphasized that the fabrication steps shown in FIG. 4 can be performed in alternative orders, that certain steps may be omitted, and that additional steps may be performed in alternative embodiments. Furthermore, various steps in the manufacture of microelectronic packages and components included within the microelectronic packages described below are well-known and, in the interests of brevity, will only be mentioned briefly herein or will be omitted entirely without providing the well-known process details. Exemplary method 70 will be described herein below in conjunction with the manufacture of the exemplary microelectronic package 20 described above in conjunction with FIGS. 1-3 and further illustrated at various stages of manufacture in FIGS. 5-8. It will be appreciated, however, that exemplary method 70 can be utilized to produce various other types of microelectronic packages wherein it is desired to bond a plurality of microelectronic die to leadframes utilizing a die attach material, while preventing encroachment of the die attach material into a central or interior keep-out area included within each die.

Figure 5:
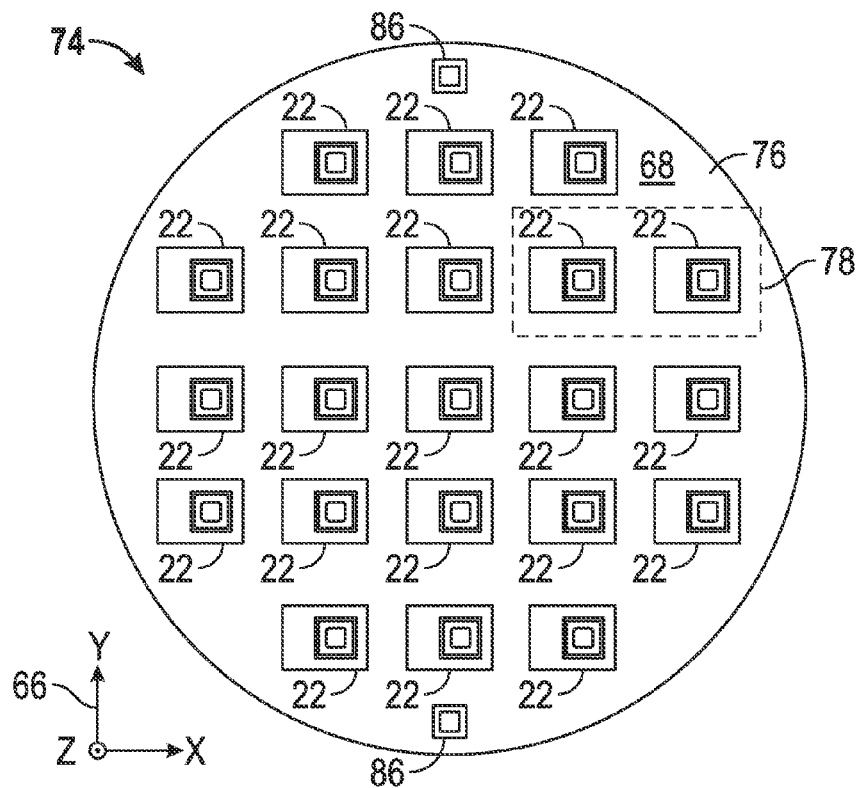
FIGS. 5-7 are top-down or planform views of a non-singulated wafer on which a number of microelectronic devices has been formed and over which a patterned die attach material is printed in accordance with the exemplary method of FIG. 4.

Exemplary method 70 commences with the production of a semiconductor workpiece or wafer containing an array of integrally-formed microelectronic devices (STEP 72, FIG. 4). FIG. 5 is a top-down view of the backside 68 of a semiconductor wafer 74, which may be processed to form a plurality of microelectronic devices thereon during STEP 72 of method 70. It can be seen in FIG. 5 that exemplary wafer 74 includes a non-singulated body 76 over which the array of partially-fabricated microelectronic devices is distributed in, for example, a grid pattern. In one embodiment, each microelectronic device formed on wafer 74 is a MEMS device, such as a PRT pressure sensor of the type shown in FIGS. 1-3 (and described as "microelectronic devices 22" hereafter). The rectangular outline or final planform shape of microelectronic devices 22 is shown in FIG. 5 to more clearly demarcate the individual devices 22 and the intervening saw or dicing lanes; it will be appreciated, however, that microelectronic devices 22 are integrally joined at this juncture in fabrication as semiconductor wafer 74 has not yet been singulated. Finally, although not shown in FIG. 5, it will be appreciated that the frontside of semiconductor wafer 74 may also be processed during STEP 72 (FIG. 4) to produce diaphragm 46 (FIG. 3), the active devices and local interconnections, and cap 54 (FIG. 3) for each of the non-singulated microelectronic devices 22 included within wafer 74. Two microelectronic devices 22 included within a region 78 of wafer 74 are further illustrated in FIG. 6 in greater detail wherein the interior keep-out areas of microelectronic devices 22 are identified by dashed boxes 62. As identified in FIG. 6, wafer 74 has been processed to impart microelectronic devices 22 with the structural features described above in conjunction with FIG. 3 and visible through wafer backside 68, including PRT backside cavity 50 and outer stress relief trench 58.

Figure 6:
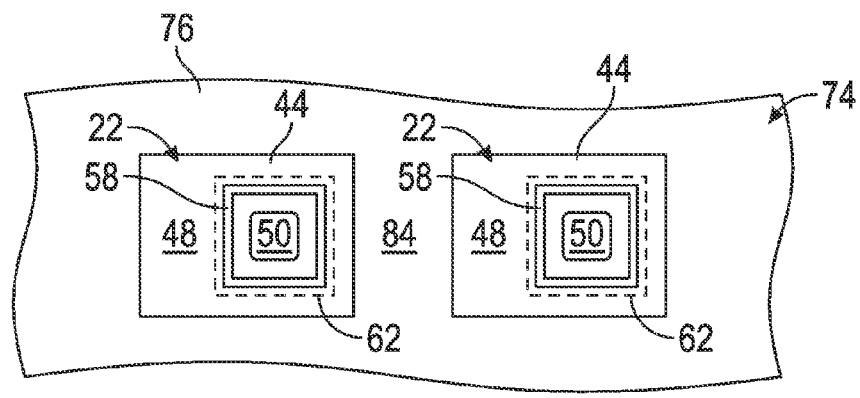

Continuing with exemplary method 70 (FIG. 4), a patterned die attach material is next printed onto backside 68 of wafer 74 (PROCESS 80). As indicated above, the die attach material is printed in a predetermined or controlled pattern such that the die attach material contacts and adheres to an outer peripheral portion of each of PRT die 44 without encroaching into the central or interior keep-out areas 62 (FIG. 6). While any printing process capable of applying the die attach material over backside 68 of wafer 74 (FIGS. 5 and 6) in such a controlled pattern can be employed, a silk screen printing process is preferably utilized. In this case, and as indicated in FIG. 4 at STEP 82, a mesh stencil or patterned screen having a predetermined pattern (as opposed to a blanket stencil or screen) may be positioned over backside 68 of wafer 74. The silk screen is patterned such that, when properly aligned with wafer 74, the pattern of the screen covers the interior keep-out areas 62 (FIG. 6) of microelectronic devices 22 (FIGS. 5 and 6). Conversely, the openings in the patterned screen expose the regions of wafer 74, which will form the undersides of PRT die 44 post-singulation. The saw lanes (one of which is identified in FIG. 6 by reference numeral "84") between integrally-formed devices 22 may either be covered by or left exposed through the screen. In one embodiment, the patterned screen is patterned to cover only keep-out areas 62 (FIG. 6) such saw lanes 84 and all other regions of backside 68 of wafer 74 are exposed through the patterned screen. Proper alignment of the patterned screen to the wafer 74 can be accomplished in a number of different ways, including through the usage of the features of devices 22 (e.g., backside cavities 50 or trenches 58) as a spatial reference point. However, alignment of the patterned screen to wafer 74 is conveniently accomplished utilizing fiduciary markers or alignments features 86 provided on backside of wafer 74 (FIG. 5) and conventionally utilized for alignment of lithographical tools utilized for pattern of wafer 74.

Figure 7:
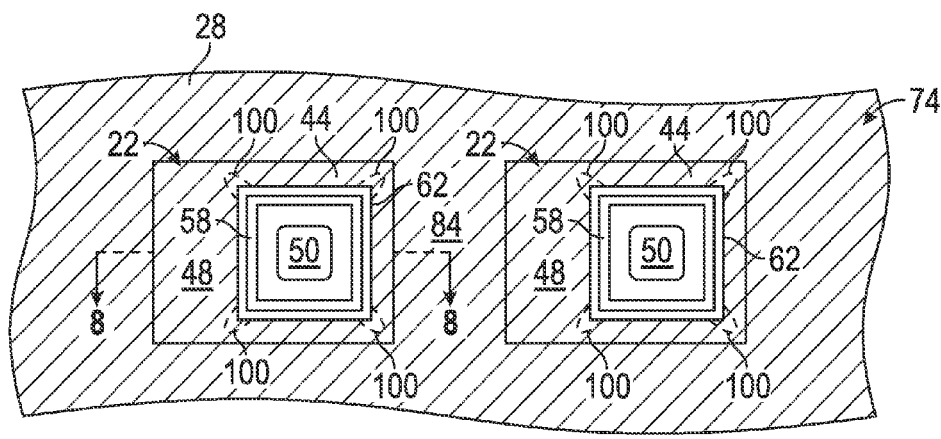

Next, during STEP 88 of exemplary method 70 (FIG. 4), the die attach material is applied through the openings in the patterned stencil or screen. Application of the die attach material through the stencil may be performed utilizing a specialized squeegee or other tool. The die attach material contacts and adheres to only those portions of wafer 74 and partially-completed microelectronic devices 22 exposed through the patterned screen, including the outer peripheral portions of devices 22 and, perhaps, saw lanes 84 (FIG. 6). Conversely, the patterned screen covers interior keep-out areas 62 (FIG. 6) and prevents the application of the die attach material thereover. As a result, the die attach material is applied to backside 68 of wafer 74 (FIGS. 5 and 6) in a predetermined pattern such that the die attach material surrounds, but does not encroach into interior keep-out areas 62 (FIG. 6). The result of this step is shown in FIG. 7 wherein die attach material 28 (represented in FIG. 7 by cross-hatching) has been applied over the entirety of backside 68 of wafer 74 with the exclusion of interior keep-out areas 62. Additionally, if desired, die attach material 28 may also be printed to have a pattern including recesses 100 located at the corners of interior keep-out area 62 to provide reservoirs into which excess die attach material may flow during die placement and compression of the die attach material. Die attach material 28 can be any material suitable for bonding microelectronic devices 22 to their corresponding leadframes amenable to application utilizing a silk screening or other patterned printing process of the type described above. This notwithstanding, the die attach material is preferably a printable liquid adhesive and, more preferably, a printable B-stage epoxy. In one embodiment, patterned die attach material 28 is applied to a thickness between about 10 and about 75 microns (μm), although die attach material 28 may be thicker or thinner in other embodiments.

The patterned die attach material 28 (FIG. 7) may be partially cured after printing onto semiconductor wafer 74 (STEP 90, FIG. 4), whether by heat, exposure to ultraviolet light, or other means. Partial curing is conveniently performed by thermal treatment of semiconductor wafer 74; e.g., exposure of wafer 74 to elevated temperatures less and/or to time periods more brief than those required for full cure of the die attach material. In embodiments wherein a B-stage epoxy is selected for usage as die attach material 28, a B-stage curing process is carried-out. In one embodiment wherein a printable B-stage epoxy is selected as the die attach material, the B-stage curing process may involve exposure of the epoxy to an elevated temperature of about 100° C. for a first time period (e.g., about 20 minutes), followed by exposure to an elevated temperature of about 120° C. for a second time period (e.g., about 20 minutes). Partial curing increases the hardness of the die attach material to minimize distortion of the die attach material pattern when the die are placed onto the leadframes in the manner described below.

Figure 8:
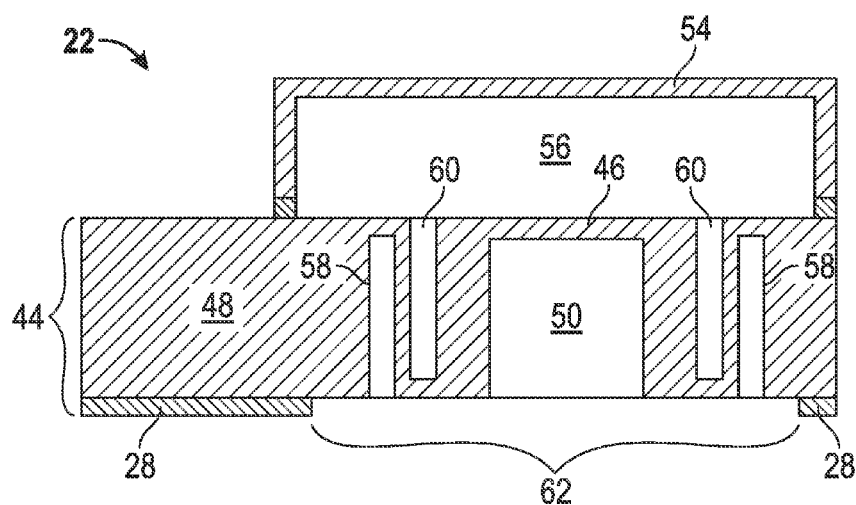
FIG. 8 is a cross-sectional view of the exemplary microelectronic device, as taken along line 8-8 in FIG. 7, after wafer singulation and prior to attachment of the microelectronic device to the leadframe shown in FIGS. 1-3.

Wafer singulation is next carried-out to separate microelectronic devices 22 and yield a plurality of singulated devices including singulated microelectronic die 44 (STEP 92, FIG. 4). Wafer singulation is preferably performed by dicing wherein a conventional dicing saw (e.g., a water-cooled diamond saw) is utilized to remove material from the saw streets or dicing lanes of semiconductor wafer 74 and thereby define the sidewalls of PRT die 44 and, more generally, of microelectronic devices 22. It will be appreciated, however, that other singulation techniques can be employed to separate devices 22 including, for example, laser cutting and scribing with breaking. Dicing tape may be placed over backside 68 (FIGS. 5 and 6) of wafer 74 and cover microelectronic devices 22 prior to singulation. Due to the controlled adhesive voids created within keep-out areas 62 (FIG. 6) and the resulting non-planar topology of the underside of devices 22 (that is, the step-down when transitioning from the region of devices 22 covered by die attachment material 28 to keep-out areas 62), it can be difficult to form an adequate seal around keep-out areas 62 utilizing conventional dicing tape wherein the thickness of the adhesive is a relatively small fraction of the total tape thickness. If an adequate seal is not formed, ingress of saw debris and the liquid coolant (e.g., cooling water containing certain additives, such as a cutting agent) utilized to cool the dicing saw can occur, which may result in contamination of outer stress relief trench 58 or backside PRT cavity 50. Thus, in preferred embodiments, a dicing tape having a relatively thick adhesive is utilized to ensure that an adequate seal is formed around keep-out areas 62 to prevent the ingress of the liquid coolant. In this regard, and by way of example only, keep-out areas 62 may be covered utilizing a dicing tape having an adhesive layer that is at least 50% the thickness of die attachment material 28. FIG. 8 illustrates one exemplary microelectronic device 22 after singulation of wafer 74, as shown in cross-section taken along line 8-8 identified in FIG. 7.

After wafer dicing, each of the newly-singulated microelectronic devices 22 may be placed on the die flags of leadframes utilizing, for example, a pick and place tool (STEP 94, FIG. 4). For example, microelectronic device 22 and, specifically, PRT die 44 shown in FIG. 8 may now be placed onto the die flag of a leadframe, such as the die flag 24 of leadframe 26 shown in FIG. 3. The die flag may be heated utilizing, for example, a heated stage or other means during this process to soften die attach material 28 upon contact and thereby an initial adherence or tack to maintain the position of device 22 through full curing. Thermal processing may then be carried-out in a specialized oven to fully cure die attach material 28 and strengthen the bond between the microelectronic devices 22 and their respective leadframes 26. As noted above, the process parameters for the full cure will vary depending upon various factors, including the particular epoxy or other material selected for usage as the die attach material. In one embodiment wherein the die attach material comprises a B-stage epoxy of the type described above, full curing may entail exposure of each microelectronic device 22 to an elevated temperature of about 160° C. for a time period of about 2 hours. After curing of the die attach material, conventional packaging steps may be performed to complete production of the microelectronic packages 20 (FIGS. 1-3). Such additional processing steps may include, but are not limited to, formation of interconnections between bond pads provided on the microelectronic devices and the package contacts (e.g., wire bonding, as shown in FIG. 3) and encapsulation to produce the molded package body (e.g., molded body 39 shown in FIGS. 1-3).

There has thus been provided embodiments of a method for fabricating a plurality of microelectronic packages wherein the die attach material, such as a B-stage epoxy, is printed onto to-be-packaged microelectronic die in a predetermined pattern over a non-singulated wafer. The die attach material is printed to have controlled voids corresponding to an interior keep-out area, such as a central keep-out area, provided on each die. The interior or central keep-out area may encompass or contain stress relief trenches, backside cavities, bond pads, or other features formed on the die backside, which are ideally not contacted by or infiltrated by the die attach material during the die attach process. Such a fabrication method is especially useful in the production of leadframe-based microelectronic packages containing stress-isolated MEMS devices, such as pressure sensors, having stress relief trenches that could be partially filled or bridged by the die attach material if contacted thereby during die attach. This notwithstanding, the above-described fabrication method can be utilized to produce any type of lead-frame based microelectronic package containing one or more microelectronic devices bonded to the die flag of a leadframe utilizing a printed die attach material. As a further advantage, production schedules and costs may be reduced through the wafer-level application of the die attach material as compared to conventional die attach processes wherein the die attach material is dispensed onto individual die flags prior to placement of the microelectronic die thereon.

In one embodiment, the above-described fabrication method includes printing a patterned die attach material onto the backside of a wafer including an array of non-singulated microelectronic die each having an interior keep-out area, such as a central keep-out area. The die attach material, such as a B-stage epoxy, is printed onto the wafer in a predetermined pattern such that the die attach material surrounds or otherwise borders the interior keep-out areas, but does not encroach into the interior keep-out areas. The wafer is singulated to produce singulated microelectronic die each including a layer of die attach material. The singulated microelectronic die are then placed onto leadframes or other package substrates with the die attach material contacting the package substrates. The layer of die attach material is then fully cured to adhere an outer peripheral portion of the singulated microelectronic die to its package substrate.

In a further embodiment, the fabrication method includes printing a die attach material onto the backside of the wafer including an array of non-singulated, stress-isolated Microelectromechanical Systems ("MEMS") die each having at least one stress relief trench exposed through the underside of the die. The die attach material is printed onto the backside of the wafer in a predetermined pattern containing a plurality of controlled voids each encompassing the at least one stress relief trench of a MEMS die including within the array of non-singulated, stress-isolated MEMS die. The die attach material is partially cured, and the wafer is diced to separate the plurality of non-singulated, stress-isolated MEMS die into singulated, stress-isolated MEMS die. The singulated, stress-isolated MEMS die are then bonded to the die flags of a number of leadframes by placing the singulated, stress-isolated MEMS die onto the leadframes such that the die attach material contacts the die flags and then fully curing the die attach material. The singulated, stress-isolated MEMS die are encapsulated to produce a plurality of microelectronic packages.

In a still further embodiment, the method for fabricating a plurality of microelectronic package comprises bonding or otherwise attaching a die to a package substrate. The die includes a die body formed by processing and singulation of a wafer, a layer of adhesive preprinted over the die body prior to singulation of the wafer, and a controlled void formed in the adhesive layer underneath an interior portion of the die body. The die is attached to the package substrate by placing the layer of adhesive in contact with the package substrate and fully curing the layer of adhesive. After the die is attached to the package substrate, the die and the package substrate are encapsulated. In preferred embodiments, the adhesive is partially cured prior to singulation of the wafer and attachment of the die to the package substrate.

Embodiments of a microelectronic package have also been provided. In one embodiment, the microelectronic package includes a stress-isolated Microelectromechanical Systems ("MEMS") die including: (i) a die body having a central portion and an outer peripheral portion surrounding the central portion; (ii) a stress relief trench formed in the central portion the die body and exposed through the underside thereof; and (iii) an interior (e.g., central) keep-out area encompassing the stress relief trench. The microelectronic package further includes a leadframe having a die flag and a layer of die attach material bonding the outer peripheral portion the die body to the die flag. The layer of die attach material surrounds, but not encroaching into the interior keep-out area.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention, as set-forth in the appended claims.

What is claimed is:

1. A method for fabricating a plurality of microelectronic packages, the method comprising:
    printing a patterned die attach material onto the backside of a wafer including an array of non-singulated microelectronic die each having an interior keep-out area, the patterned die attach material not encroaching into the interior keep-out areas of the array of non-singulated microelectronic die;
    after printing the patterned die attach material onto the backside of the wafer, singulating the wafer to separate the plurality of non-singulated microelectronic die and produce a plurality of singulated microelectronic die each including a layer of die attach material;
    placing each of the plurality of singulated microelectronic die on a package substrate with the layer of die attach material contacting the package substrate; and
    fully curing the layer of die attach material to adhere an outer peripheral portion of at least one of the plurality of singulated microelectronic die to its package substrate.

2. The method of claim 1 wherein printing comprises:
    positioning a patterned screen over the backside of the wafer; and
    applying the die attach material through openings in the patterned screen and onto the array of non-singulated microelectronic die such that the die attach material does not encroach into the interior keep-out areas of the array of non-singulated microelectronic die.

3. The method of claim 1 wherein printing comprises printing a patterned die attach material onto the backside of a wafer including an array of non-singulated microelectronic die each having a central keep-out area, the patterned die attach material surrounding, but not encroaching into the central keep-out areas of the array of non-singulated microelectronic die.

4. The method of claim 1 further comprising partially curing the patterned die attach material after printing the patterned die attach material onto the backside of the wafer and prior to singulation thereof.

5. The method of claim 4 wherein the patterned die attach material comprises a B-stage epoxy, and wherein partially curing comprising performing a B-stage cure of the B-stage epoxy after printing the patterned die attach material onto the backside of the wafer and prior to singulation thereof.

6. The method of claim 1 further comprising overmolding each of the singulated microelectronic die with an encapsulant after fully curing the layer of die attach material.

7. The method of claim 1 wherein the array of microelectronic die each comprise a microelectromechanical systems ("MEMS") device having a transducer structure, and wherein the interior keep-out area of each microelectronic die aligns with its respective transducer structure, as taken along an axis substantially orthogonal to the upper surface of the microelectronic die.

8. The method of claim 1 wherein at least a first of the microelectronic die included in the array of microelectronic die comprises a stress relief trench formed in the backside of the microelectronic die within its interior keep-out area.

9. The method of claim 8 wherein the first microelectronic die further comprises a backside cavity formed in the backside of the microelectronic die within the interior keep-out area.

10. The method of claim 9 wherein the stress relief trench circumscribes the backside cavity.

11. The method of claim 9 wherein the first microelectronic die comprises a pressure sensor including a diaphragm structure exposed through the backside cavity.

12. The method of claim 9 wherein the first microelectronic die is placed on the die flag of a leadframe such that the backside cavity aligns with an opening provided in the die flag, and wherein the die attach material is laterally recessed from the opening in the die flag.

13. The method of claim 1 wherein singulation of the wafer comprises:
    sawing the wafer along a number of saw lanes while applying a liquid coolant over the wafer to separate the plurality of non-singulated microelectronic die and produce a plurality of singulated microelectronic die each including a layer of die attach material; and
    positioning dicing tape over the saw lanes and forming a seal with the plurality of singulated microelectronic die to prevent the ingress of debris and the liquid coolant into the adhesive keep-out area during sawing.

14. The method of claim 13 wherein, during printing of the patterned die attach material, the patterned die attach material is applied over at least a portion of the saw lanes.

15. The method of claim 1 wherein, during printing of the patterned die attach material, the patterned die attach material is printed to have recesses located adjacent the corners of the central-keep-out area.

16. The method of claim 1 wherein placing comprises placing at least one of the plurality of singulated microelectronic die on the die flag of a lead frame with the layer of die attach material contacting the die flag, while heating the die flag.

17. A method for fabricating a plurality of microelectronic packages, the method comprising:
- attaching a die to a package substrate, the die comprising:
  - a die body formed by processing and singulation of a wafer;
  - a layer of adhesive preprinted over the die body prior to singulation of the wafer; and
  - a controlled void formed in the adhesive layer underneath an interior portion of the die body;
- encapsulating the die and the package substrate after attaching the die to the package substrate;
- wherein the die is attached to the package substrate by placing the layer of adhesive in contact with the package substrate and fully curing the layer of adhesive.

18. The method of claim 17 wherein the adhesive is partially cured prior to singulation of the wafer and attachment of the die to the package substrate.

\* \* \* \* \*